US011309133B2

United States Patent
Park et al.

(10) Patent No.: US 11,309,133 B2
(45) Date of Patent: Apr. 19, 2022

(54) MULTILAYER ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Heung Kil Park, Suwon-si (KR); Hun Gyu Park, Suwon-si (KR); Se Hun Park, Suwon-si (KR); Gu Won Ji, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/860,704

(22) Filed: Apr. 28, 2020

(65) Prior Publication Data

US 2021/0202175 A1 Jul. 1, 2021

(30) Foreign Application Priority Data

Dec. 31, 2019 (KR) .......................... 10-2019-0178986

(51) Int. Cl.
*H01G 4/12* (2006.01)
*H01G 4/248* (2006.01)
(Continued)

(52) U.S. Cl.
CPC ................. *H01G 4/30* (2013.01); *H01G 4/12* (2013.01); *H01G 4/248* (2013.01); *H05K 1/111* (2013.01);
(Continued)

(58) Field of Classification Search
CPC .......... H01G 2/065; H01G 4/12; H01G 4/248; H01G 4/30; H01G 4/005; H01G 4/1209;
(Continued)

(56) References Cited

U.S. PATENT DOCUMENTS 6,998,290 B2 * 2/2006 Adae-Amoakoh .......................... H01L 23/49822
438/106
2001/0022401 A1 * 9/2001 Nakamura ........ H01L 27/14618
257/778
(Continued)

FOREIGN PATENT DOCUMENTS

CN 104979097 A * 10/2015 ............... H01G 2/06
CN 105895370 A * 8/2016 ............... H01G 4/35
(Continued)

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

The multilayer electronic component includes a capacitor body having first to sixth surfaces; first and second external electrodes including first and second connecting portions, and first and second band portions; first and second connection terminals connected to the first band portion; and third and fourth connection terminals connected to the second band portion. The first and second connection terminals include a first connection surface facing the first band portion, a second connection surface opposing the first connection surface, and a first circumferential surface connecting the first and second connection surfaces, a cross section of the first circumferential surface being circular. The third and fourth connection terminals include a third connection surface facing the second band portion, a fourth connection surface opposing the third connection surface, and a second circumferential surface connecting the third and fourth connection surfaces, a cross section of the second circumferential surface being circular.

16 Claims, 7 Drawing Sheets

(51) Int. Cl.
*H01G 4/30* (2006.01)
*H05K 1/11* (2006.01)
*H05K 1/18* (2006.01)

(52) U.S. Cl.
CPC ... *H05K 1/181* (2013.01); *H05K 2201/10015* (2013.01)

(58) Field of Classification Search
CPC ........ H01G 4/232; H01G 4/2325; H01G 4/38; H05K 1/111; H05K 1/181; H05K 1/11; H05K 1/18; H05K 1/0271; H05K 2201/10015; H05K 2201/068; H05K 2201/10522; H05K 2201/10636; H05K 3/341; H05K 3/3442
USPC ..... 176/260; 361/306.3, 321.2, 301.4, 321.5, 361/321.4; 174/260
See application file for complete search history.

(56) References Cited

U.S. PATENT DOCUMENTS

| | | |
|---|---|---|
| 2014/0016242 A1 | 1/2014 | Hattori et al. |
| 2016/0217926 A1 | 7/2016 | Jun et al. |
| 2018/0323010 A1* | 11/2018 | Park ........................ H05K 1/181 |
| 2020/0118757 A1* | 4/2020 | Kageyama ........... H01G 4/2325 |
| 2020/0281078 A1* | 9/2020 | Takahashi .............. H05K 1/181 |

FOREIGN PATENT DOCUMENTS

| | | |
|---|---|---|
| JP | H06-84687 A | 3/1994 |
| JP | 2012-204572 A | 10/2012 |
| KR | 10-2016-0090589 A | 8/2016 |

* cited by examiner

MULTILAYER ELECTRONIC COMPONENT AND BOARD HAVING THE SAME MOUNTED THEREON

CROSS-REFERENCE TO RELATED APPLICATION(S)

This application claims benefit under 35 USC 119(a) of Korean Patent Application No. 10-2019-0178986 filed on Dec. 31, 2019 in the Korean Intellectual Property Office, the entire disclosure of which is incorporated herein by reference for all purposes.

TECHNICAL FIELD

The present disclosure relates to a multilayer electronic component and a board having the same mounted thereon.

BACKGROUND

Multilayer electronic components, such as multilayer capacitors, are formed of a dielectric material, which is piezoelectric and may be deformed in synchronization with an applied voltage.

At this time, when the period of the applied voltage is within the audible frequency band, the displacement becomes vibrations and is transmitted to the substrate through solders, and the vibration of the substrate may be audible. This sound is known as acoustic noise.

Such acoustic noise may be perceived as a malfunction of the device by a user or as an abnormal sound when the operating environment of the device is quiet.

In addition, in a device having a voice circuit, the acoustic noise may be superimposed on the voice output to reduce the quality of the device.

In addition, apart from acoustic noise perceived by the human ear, when the piezoelectric vibrations of the multilayer capacitor are generated in a high frequency region of 20 kHz or more, the piezoelectric vibrations may cause malfunctioning of various sensors used in IT and industrial/electric fields.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a multilayer electronic component in which acoustic noise and high frequency vibrations of 20 kHz or more may be reduced, and a board having the same mounted thereon.

According to an aspect of the present disclosure, a multilayer electronic component includes a capacitor body including a plurality of dielectric layers and a plurality of first and second internal electrodes alternately disposed with the dielectric layer interposed therebetween, the capacitor body having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the plurality of first and second internal electrodes being exposed to the third and fourth surfaces, respectively; first and second external electrodes including first and second connecting portions disposed on the third and fourth surfaces of the capacitor body, respectively, and first and second band portions extending from the first and second connecting portions to portions of the first surface of the capacitor body, respectively; first and second connection terminals connected to the first band portion, on a first surface side of the capacitor body, and spaced apart from each other; and third and fourth connection terminals connected to the second band portion, on the first surface side of the capacitor body, and spaced apart from each other. Each of the first and second connection terminals includes a first connection surface facing the first band portion, a second connection surface opposing the first connection surface, and a first circumferential surface connecting the first and second connection surfaces, a cross section of the first circumferential surface being circular. Each of the third and fourth connection terminals includes a third connection surface facing the second band portion, a fourth connection surface opposing the third connection surface, and a second circumferential surface connecting the third and fourth connection surfaces, a cross section of the second circumferential surface being circular.

The first to fourth connection terminals may have a cylindrical shape.

The first to fourth connection terminals may be respectively provided with a groove disposed therein and being open toward a mounting surface.

The first to fourth connection terminals may be respectively provided with a hole disposed therein in a direction connecting the first and second surfaces of the capacitor body.

The first and second connection terminals may be spaced apart from an edge of the first band portion, and the third and fourth connection terminals may be spaced apart from an edge of the second band portion.

The multilayer electronic component may further include first and second conductive adhesive layers disposed between the first connection terminal and the first band portion and between the second connection terminal and the first band portion, respectively, and third and fourth conductive adhesive layers disposed between the third connection terminal and the second band portion and between the fourth connection terminal and the second band portion, respectively.

The multilayer electronic component may further include a plating layer respectively plated on external surfaces of the first to fourth connection terminals, and the plating layer may include one of tin (Sn) and gold (Au).

The first and second connection terminals may be spaced apart from each other in a direction connecting the fifth and sixth surfaces of the capacitor body, and the third and fourth connection terminals may be spaced apart from each other in the direction connecting the fifth and sixth surfaces of the capacitor body.

According to an aspect of the present disclosure, a board having a multilayer electronic component mounted thereon includes a substrate having first and second electrode pads on one surface, and the multilayer electronic component. First and second connection terminals are disposed on the first electrode pad to be connected thereto, and third and fourth connection terminals are disposed on the second electrode pad to be connected thereto.

According to an aspect of the present disclosure, a multilayer electronic component includes a capacitor body including dielectric layers and first and second internal electrodes alternately disposed with the dielectric layer interposed therebetween, the capacitor body including first and second surfaces opposing each other; first and second external electrodes respectively connected to the first internal electrodes and the second internal electrodes, and each including a portion disposed on the first surface of the capacitor body; a first connection terminal disposed on the portion of the first external electrode; and a second connection terminal disposed on the portion of the second external electrode. Each of the first and second connection terminals has a recess extending from a lower surface thereof toward an upper surface thereof in a direction from the first surface to the second surface.

The recess of the first connection terminal may be spaced apart from the upper surface of the first connection terminal, and the recess of the second connection terminal may be spaced apart from the upper surface of the second connection terminal.

The recess of the first connection terminal may extend to the upper surface of the first connection terminal, and the recess of the second connection terminal may extend to the upper surface of the second connection terminal.

The multilayer electronic component may further include a first conductive adhesive layer disposed between the first connection terminal and the portion of the first external electrode; and a second conductive adhesive layer disposed between the second connection terminal and the portion of the second external electrode.

The multilayer electronic component may further include a plating layer respectively plated on external surfaces of the first and second connection terminals. The plating layer may include one of tin (Sn) and gold (Au).

The multilayer electronic component may further include a third connection terminal disposed on the portion of the first external electrode and spaced apart from the first connection terminal; and a fourth connection terminal disposed on the portion of the second external electrode and spaced apart from the second connection terminal.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
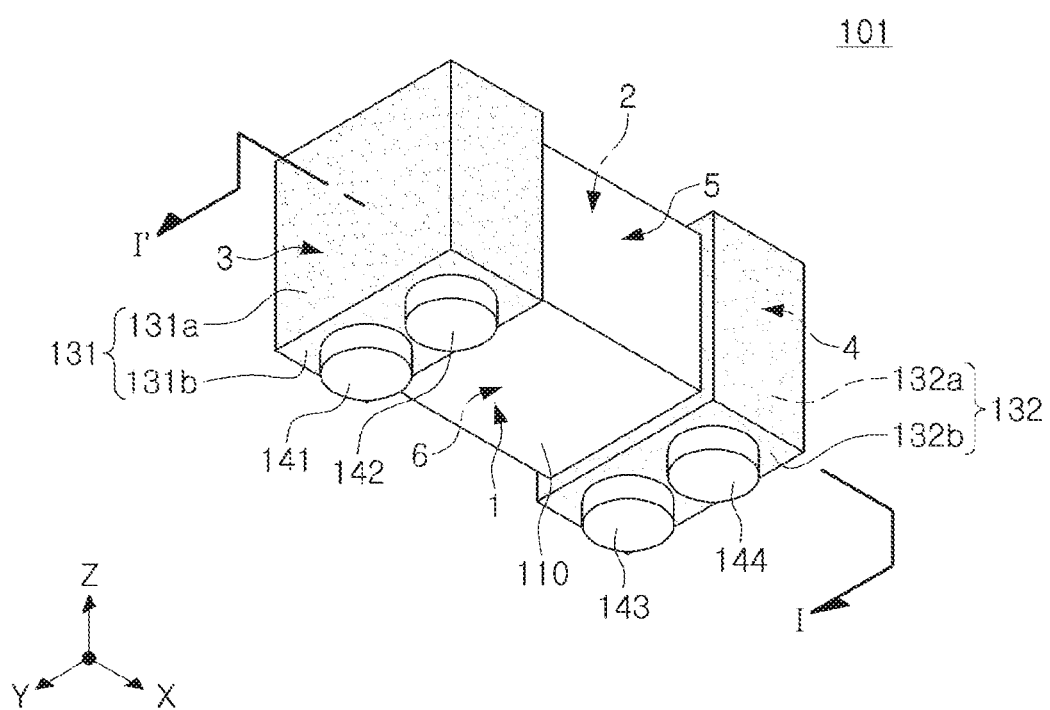
FIG. 1 is a perspective view illustrating a multilayer electronic component according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Figure 2:
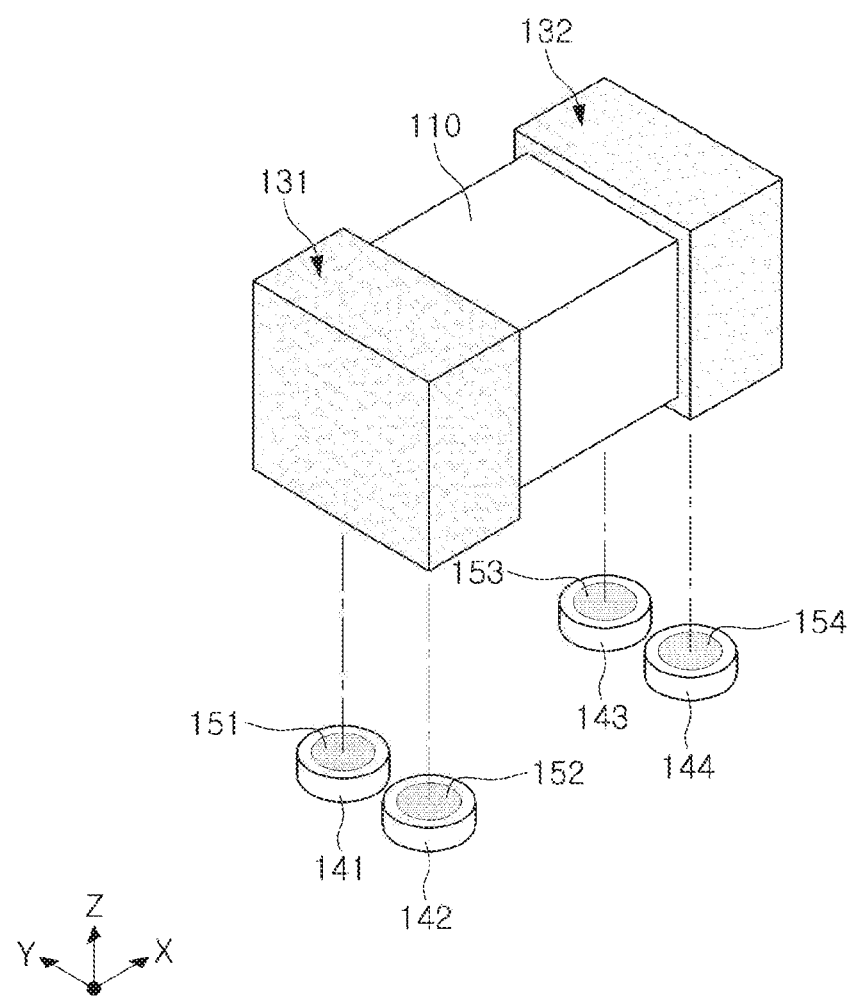
FIG. 2 is an exploded perspective view of FIG. 1.
Figure 3A:
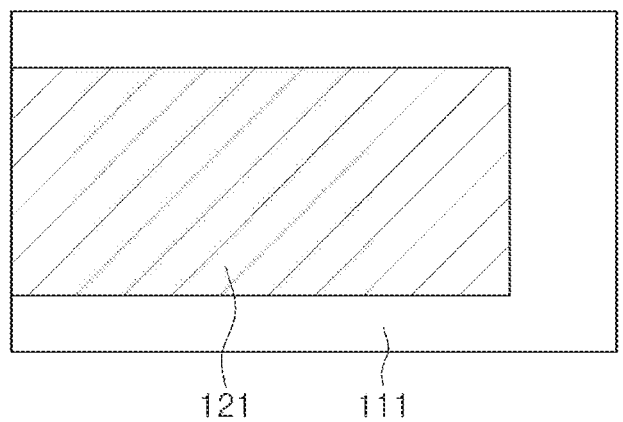
FIGS. 3A and 3B are plan views illustrating first and second internal electrodes of a multilayer electronic component according to an embodiment, respectively.
Figure 3B:
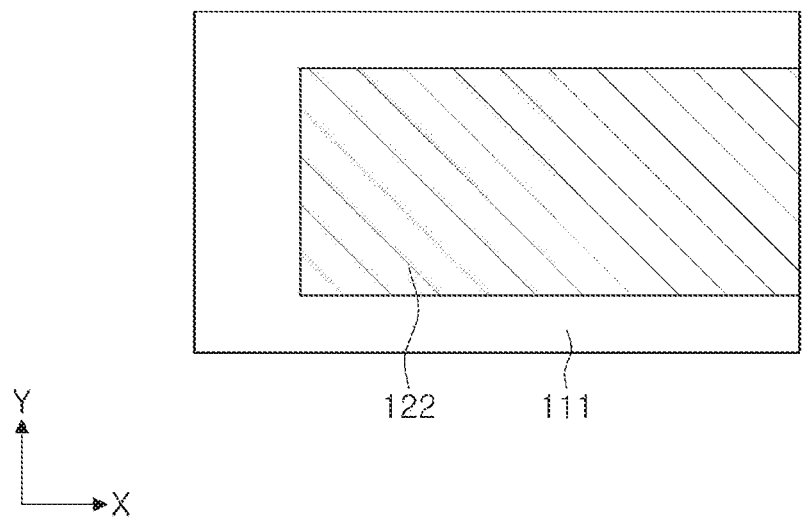
Figure 4:
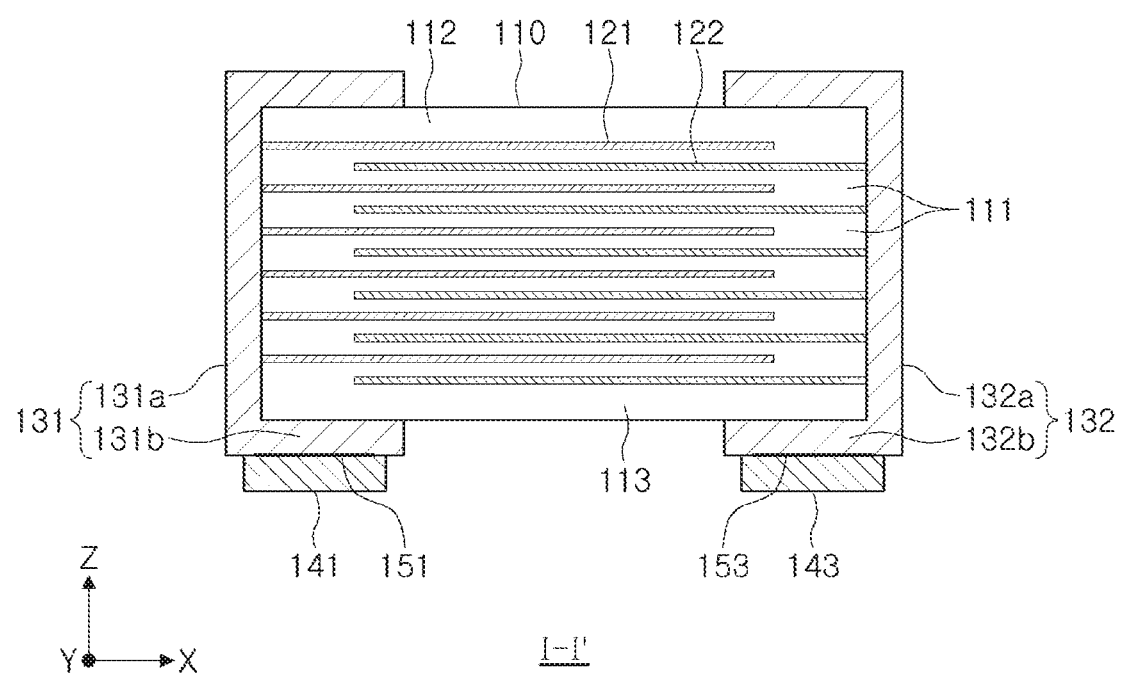
FIG. 4 is a cross-sectional view taken along line I-I' of FIG. 1.

FIG. 1 is a perspective view illustrating a multilayer electronic component according to an embodiment. FIG. 2 is an exploded perspective view of FIG. 1. FIGS. 3A and 3B are plan views illustrating first and second internal electrodes of a multilayer electronic component according to an embodiment, respectively.

Hereinafter, when defining the direction of a capacitor body 110 to clearly describe embodiments, X, Y and Z illustrated in the drawing indicate the length direction, width direction and thickness direction of the capacitor body 110, respectively. In addition, in the embodiment, the Z direction may be used as having the same concept as the stacking direction in which the dielectric layers are laminated.

Referring to FIGS. 1 to 5, a multilayer electronic component 101 according to an embodiment may include the capacitor body 110, first and second external electrodes 131 and 132, and first to fourth connection terminals 141, 142, 143 and 144.

The capacitor body 110 is obtained by stacking a plurality of dielectric layers 111 in the Z direction to then be fired, and may be integrated such that boundaries between adjacent dielectric layers 111 of the capacitor body 110 may not be identified.

In this case, the capacitor body 110 may be substantially hexahedral, but the shape thereof is not limited thereto.

In this embodiment, for convenience of description, both surfaces of the capacitor body 110 opposing each other in the Z direction are defined as first and second surfaces 1 and 2, both sides thereof connected to the first and second surfaces 1 and 2 and opposing each other in the X direction are defined as third and fourth faces 3 and 4, and both surfaces thereof connected to the first and second surfaces 1 and 2, connected to the third and fourth Surfaces 3 and 4, and opposing each other in the Y direction may be defined as fifth and sixth surfaces 5 and 6. In this embodiment, the first surface 1 may be a mounting surface.

On the other hand, the shape, the dimensions of the capacitor body 110, and the number of stacked layers of the dielectric layer 111 are not limited to those illustrated in the drawings according to this embodiment.

The capacitor body 110 may include an active region that contributes to capacitance formation of the capacitor, and upper and lower covers 112 and 113 formed upper and lower portions of the active region as upper and lower margins, respectively.

The active region includes a plurality of dielectric layers 111 and a plurality of first and second internal electrodes 121 and 122 alternately disposed in the Z direction with the dielectric layer 111 interposed therebetween.

The dielectric layer 111 may include a ceramic material having a high dielectric constant, and may include, for example, $BaTiO_3$-based ceramic powder, but an embodiment thereof is not limited thereto.

In this case, the $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ or the like, in which calcium (Ca), zirconium (Zr) or the like is partially solidified in $BaTiO_3$, but an embodiment thereof is not limited thereto.

In addition, in addition to the ceramic powder, a ceramic additive, an organic solvent, a plasticizer, a binder, a dispersant, and the like may be further added to the dielectric layer 111.

As the ceramic additive, for example, a transition metal oxide or a transition metal carbide, rare earth element, magnesium (Mg), aluminum (Al), or the like may be used.

The upper and lower covers 112 and 113 may have the same material and configuration as those of the dielectric layer 111 except for not including internal electrodes.

The upper and lower covers 112 and 113 may be formed by stacking a single dielectric layer or two or more dielectric layers on the upper and lower surfaces of the active region in the Z direction, respectively, and may basically serve to prevent damage to the first and second internal electrodes 121 and 122 due to physical or chemical stresses.

The first and second internal electrodes 121 and 122 are electrodes having different polarities, and are alternately disposed to face each other in the Z direction with the dielectric layer 111 interposed therebetween, and one ends of the first and second internal electrodes 121 and 122 may be exposed to the third and fourth surfaces 3 and 4 of the capacitor body 110, respectively.

In this case, the first and second internal electrodes 121 and 122 may be electrically insulated from each other by the dielectric layer 111 interposed therebetween.

The end portions of the first and second internal electrodes 121 and 122 alternately exposed through the third and fourth surfaces 3 and 4 of the capacitor body 110 may be electrically connected to the first and second external electrodes 131 and 132 disposed on the third and fourth surfaces 3 and 4 of the capacitor body 110, to be described later, respectively.

In this case, the first and second internal electrodes 121 and 122 may be formed of a conductive metal, for example, a material such as nickel (Ni) or nickel alloys, but the material thereof is not limited thereto.

According to the above configuration, when a predetermined voltage is applied to the first and second external electrodes 131 and 132, charges are accumulated between the first and second internal electrodes 121 and 122 facing each other.

At this time, the capacitance of the multilayer electronic component 101 is proportional to the overlapped area of the first and second internal electrodes 121 and 122 overlapping each other in the Z direction.

The first and second external electrodes 131 and 132 may be provided with voltages having different polarities, and may be electrically connected to the exposed portions of the first and second internal electrodes 121 and 122, respectively.

Plating layers may be formed on the surfaces of the first and second external electrodes 131 and 132 as necessary.

For example, the first and second external electrodes 131 and 132 may include first and second conductive layers in contact with the surface of the capacitor body 110 and in direct contact with the first and second internal electrodes 121 and 122, respectively, first and second nickel (Ni) plating layers formed on the first and second conductive layers, and first and second tin (Sn) plating layers formed on the first and second nickel (Ni) plating layers, respectively.

The first external electrode 131 may include a first connecting portion 131a and a first band portion 131b.

The first connecting portion 131a is a portion formed on the third surface 3 of the capacitor body 110 to be connected to the first internal electrode 121, and the first band portion 131b is a portion which extends from the first connecting portion 131a to a portion of the first surface 1 that is the mounting surface of the capacitor body 110 and to which the first and second connection terminals 141 and 142 are connected.

In this case, solder or conductive paste may be disposed between the first band portion 131b and the first and second connection terminals 141 and 142 to form first and second conductive adhesive layers 151 and 152, respectively.

On the other hand, the first band portion 131b may further extend to a portion of the second surface 2 of the capacitor body 110 and portions of the fifth and sixth surfaces 5 and 6 as necessary to improve fixing strength.

The second external electrode 132 may include a second connecting portion 132a and a second band portion 132b.

The second connecting portion 132a is a portion formed on the fourth surface 4 of the capacitor body 110 and connected to the second internal electrode 122, and the second band portion 132b is a portion which extends from the second connecting portion 132a to a portion of the first surface 1 that is the mounting surface of the capacitor body 110 and to which the third and fourth connection terminals 143 and 144 are connected.

In this case, solder or conductive paste may be disposed between the second band portion 132b and the third and fourth connection terminals 143 and 144 to form third and fourth conductive adhesive layers 153 and 154, respectively.

On the other hand, the second band portion 132b may further extend to a portion of the second surface 2 of the capacitor body 110 and portions of the fifth and sixth surfaces 5 and 6 as necessary to improve fixing strength.

The first and second connection terminals 141 and 142 may each have a first connection surface facing the first band portion 131b of the first external electrode 131, on the first surface (1) side of the capacitor body 110, a second connection surface which is a surface opposing the first connection surface in the Z direction, and a first circumferential surface connecting the first and second connection surfaces, and may be formed to have a substantially cylindrical shape.

When the first and second connection terminals 141 and 142 are formed to have a cylindrical shape, manufacturing may be facilitated and thinning thereof may be obtained.

In this case, when the first and second connection terminals 141 and 142 include insulators, a conductor layer may be formed on the first connection surface, the second connection surface, and the first circumferential surface.

In addition, the first and second connection terminals 141 and 142 are formed to cover a portion of the first band portion 131b, on the first surface side of the capacitor body 110, and a gap is formed therebetween, and thus, the first and second connection terminals 141 and 142 are spaced apart from each other in the Y direction. The first and second connection terminals 141 and 142 may be arrange in the Y direction, although the arrangement is not limited thereto.

The third and fourth connection terminals 143 and 144 may each have a third connection surface facing the second band portion 132b of the second external electrode 132, on the first surface (1) side of the capacitor body 110, a fourth connection surface that is a surface opposing the third connection surface in the Z direction, and a second circumferential surface connecting the third and fourth connection surfaces, and may be formed to have a substantially cylindrical shape.

When the third and fourth connection terminals 143 and 144 are formed in a cylindrical shape, manufacturing is easy and thinning thereof may be obtained.

In this case, when the third and fourth connection terminals 143 and 144 include insulators, a conductor layer may be formed on the third connection surface, the fourth connection surface, and the second circumferential surface.

In addition, the third and fourth connection terminals 143 and 144 are formed on the first surface side of the capacitor body 110 to cover a portion of the second band portion 132b, and a gap therebetween in the Y direction such that the third and fourth connection terminals 143 and 144 are spaced apart from each other in the Y direction. The third and fourth connection terminals 143 and 144 may be arrange in the Y direction, although the arrangement is not limited thereto.

The first to fourth connection terminals 141, 142, 143 and 144 configured as described above may serve to separate the capacitor body 110 to be spaced apart from a substrate by a predetermined distance when the multilayer electronic component 101 is mounted on the substrate. Thus, piezoelectric vibrations to be transmitted to the substrate may be reduced, and the piezoelectric vibrations may be absorbed using the elastic deformation of the connection terminals, thereby reducing the acoustic noise.

In addition, on the first surface (1) side which is the mounting surface of the capacitor body 110, a gap between the first and second connection terminals 141 and 142 spaced apart from each other below the first band portion 131b may become a solder pocket, and a gap between the third and fourth connection terminals 143 and 144 spaced apart from each other below the second band portion 132b may become a solder pocket.

In addition, as the first to fourth connection terminals 141 to 144 have a cylindrical shape, the flow of the molten solder flows smoothly around the round shape of the connection terminals at the time of performing the mounting on the substrate, and the spreadability of the solder is good in performing the mounting on the board. Therefore, solder agglomeration on bonding portions of the connection terminals and the multilayer capacitor may be prevented.

According to this structure, the formation of solder fillet toward the second surface of the multilayer capacitor may be suppressed, thereby suppressing the transmission of the piezoelectric vibrations of the multilayer capacitor to the substrate and effectively reducing acoustic noise.

The first to fourth connection terminals 141 to 144 may be formed of a conductor such as metal. In addition, the first to fourth connection terminals 141 to 144 may be formed of a metal foil, and in this case, a relatively large quantity into a final shape through etching or the like may be easily processed at once, thereby providing excellent process efficiency.

In addition, in this embodiment, the first and second connection terminals 141 and 142 may be positioned on the first band portion 131b to be inwardly spaced apart from the edge of the first band portion 131b. The third and fourth connection terminals 143 and 144 may be positioned on the second band portion 132b to be inwardly spaced apart from the edge of the second band portion 132b.

On the other hand, the first to fourth connection terminals 141, 142, 143 and 144 may include a plating layer if necessary.

The plating layer may be a tin (Sn) plating layer or a gold (Au) plating layer formed on the first to fourth connection terminals 141, 142, 143 and 144.

If necessary, the tin (Sn) plating layer is formed, or another plating layer such as a nickel (Ni) plating layer may be further formed on the first to fourth connection terminals 141, 142, 143 and 144 before forming the tin plating layer.

Figure 5:
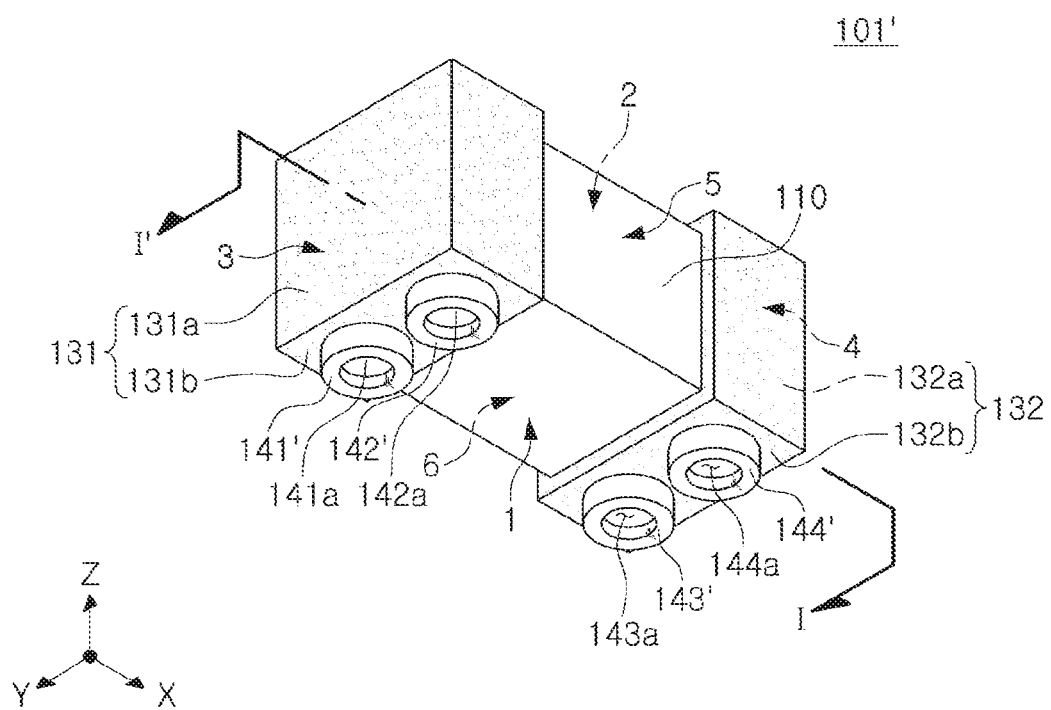
FIG. 5 is a bottom view illustrating another embodiment of a connection terminal.

FIG. 5 is a bottom view illustrating another embodiment of a connection terminal.

Referring to FIG. 5, grooves 141a, 142a, 143a and 144a may be formed in first to fourth connection terminals 141' through 144', respectively. In one example, each of the grooves 141a through 144a may include a recess extending from a lower surface of a respective one of the first to fourth connection terminals 141' through 144' toward an upper surface thereof, and may be spaced apart from the upper surface thereof. In this case, a depth of the groove 141a is less than a height of the first connection terminal 141', a depth of the groove 142a is less than a height of the second connection terminal 142', a depth of the groove 143a is less than a height of the third connection terminal 143', and a depth of the groove 144a is less than a height of the fourth connection terminal 144'.

In this embodiment, the height of solder fillet is reduced as the grooves are filled with solder when the mounting on the substrate is performed, and as a result, the effect of reducing acoustic noise may be improved.

Figure 6:
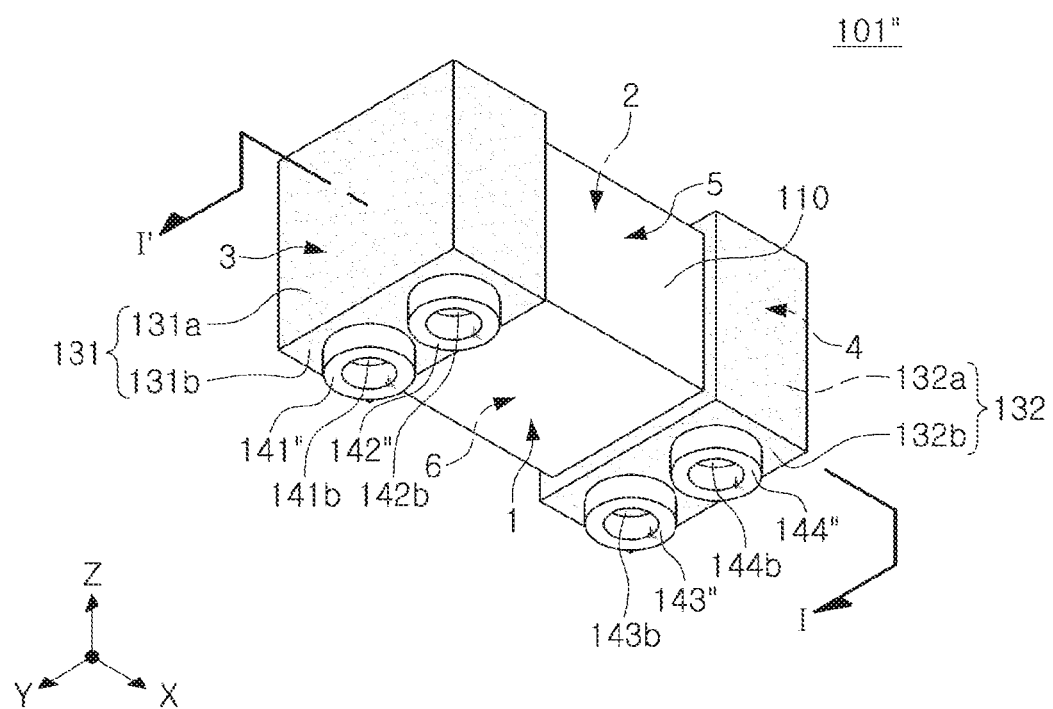
FIG. 6 is a bottom view illustrating another embodiment of a connection terminal.

FIG. 6 is a bottom view illustrating another embodiment of a connection terminal.

Referring to FIG. 6, holes 141b, 142b, 143b and 144b may be formed in first to fourth connection terminals 141" to 144", respectively.

The holes 141b and 142b, each as a recess, penetrates through the first and second connection surfaces, and the holes 143b and 144b penetrate through the third and fourth connection surfaces.

In the case of this embodiment, although the size of the first to fourth conductive adhesive layers is smaller than that in the embodiment of FIG. 2, the height of the solder fillet is reduced as the holes are filled with the solder when the mounting on the substrate is performed, resulting in improving the effect of reducing acoustic noise. Bonding force for bonding the external electrode, the connection terminal and the electrode pad of the substrate may be improved.

In a state in which a multilayer electronic component 101 is mounted on a substrate 210, when voltages having different polarities are applied to first and second external electrodes 131 and 132 formed in the multilayer electronic component 101, a capacitor body 110 expands and contracts in the thickness direction by an inverse piezoelectric effect of a dielectric layer 111, and both ends of the first and second external electrodes 131 and 132 expand and contract by a Poisson effect in contrast to the expansion and contraction of the capacitor body 110 in the Z direction.

This contraction and expansion cause vibrations. In addition, the vibration is transmitted from the first and second external electrodes 131 and 132 to the substrate 210, and the sound is radiated from the substrate 210 to become acoustic noise.

Figure 7:
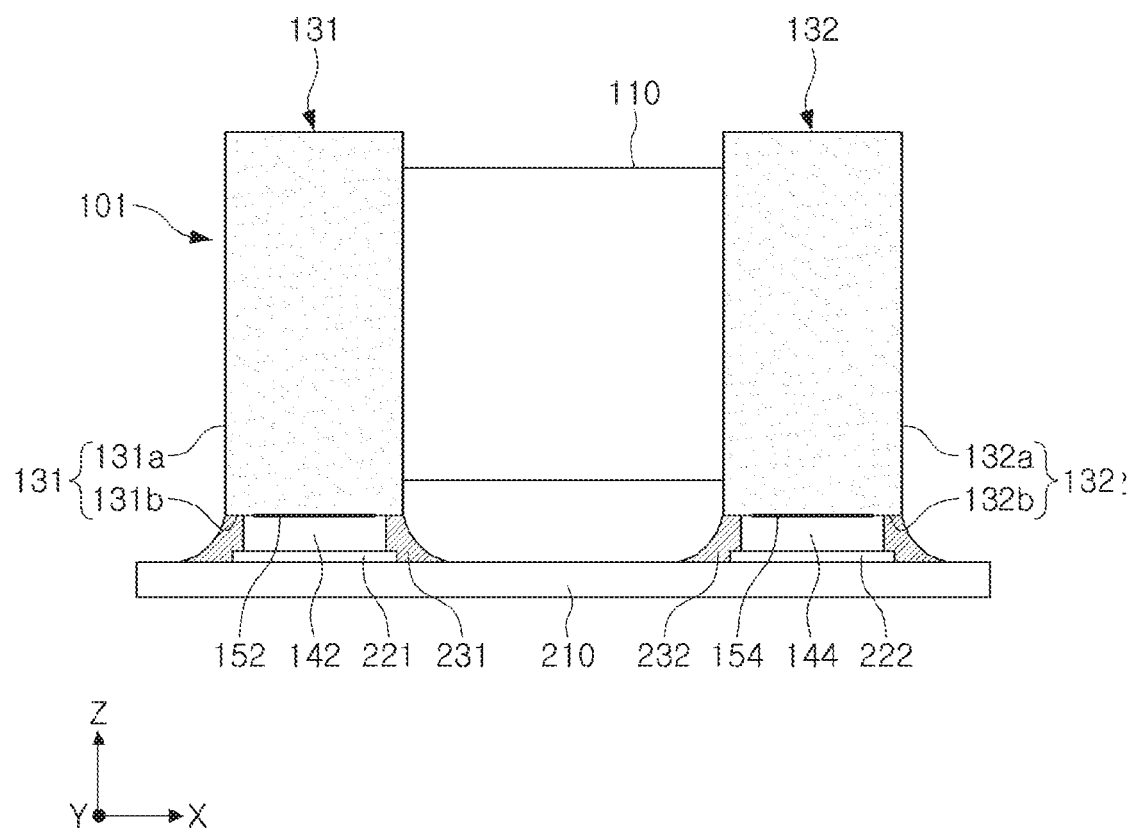
FIG. 7 is a side view schematically illustrating a state in which the multilayer electronic component of FIG. 1 is mounted on a substrate.

FIG. 7 is a side view schematically illustrating a state in which the multilayer electronic component of FIG. 1 is mounted on a substrate.

Referring to FIG. 7, a board having the multilayer electronic component according to this embodiment, mounted thereon, may include a substrate 210 having first and second electrode pads 221 and 222 on one surface thereof, and a multilayer electronic component 101 mounted on an upper surface of the substrate 210, in such a manner that first and second connection terminals 141 and 142 are connected to the first electrode pad 221 and third and fourth connection terminals 143 and 144 are connected to the second electrode pad 222.

In this embodiment, the multilayer electronic component 101 is illustrated and described as being mounted on the substrate 210 by solders 231 and 232, but a conductive paste may be used instead of the solder if necessary.

According to this embodiment, piezoelectric vibrations transmitted to the substrate through the first and second external electrodes 131 and 132 of the multilayer electronic component 101 may be absorbed through elastic deformation of the first to fourth connection terminals 141, 142, 143 and 144, thereby reducing acoustic noise.

In addition, since the connection terminals are spaced apart from each other, a gap is provided in a maximum vibration displacement region in the width direction and the longitudinal direction of the capacitor body, thereby effectively blocking a piezoelectric vibration transmission path of the multilayer electronic component 101, and thus, significantly increasing an acoustic noise reduction effect of the multilayer electronic component 101.

Further, according to this embodiment, the acoustic noise reduction structure may effectively suppress the amount of vibrations in which the piezoelectric vibrations of the multilayer electronic component are transmitted to the substrate at an audible frequency within 20 kHz of the multilayer electronic component.

Therefore, by reducing the high frequency vibration of the multilayer electronic component, malfunction of sensors that may be a problem by high frequency vibration of 20 kHz or more of the electronic component in the IT or industrial/electronic and electric field may be prevented, and the internal fatigue accumulated by the long-term vibration of the sensors may be suppressed.

As set forth above, according to an embodiment, there is an effect of reducing acoustic noise and high frequency vibration of 20 kHz or more in a multilayer electronic component.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer electronic component comprising:
   a capacitor body including a plurality of dielectric layers and a plurality of first and second internal electrodes alternately disposed with the dielectric layer interposed therebetween, the capacitor body having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the plurality of first and second internal electrodes being exposed to the third and fourth surfaces, respectively;

first and second external electrodes including first and second connecting portions disposed on the third and fourth surfaces of the capacitor body, respectively, and first and second band portions extending from the first and second connecting portions to portions of the first surface of the capacitor body, respectively, the first and second external electrodes are connected to the plurality of first and second internal electrodes, respectively;

first and second connection terminals connected to the first band portion, on a first surface side of the capacitor body, and spaced apart from each other; and third and fourth connection terminals connected to the second band portion, on the first surface side of the capacitor body, and spaced apart from each other, wherein each of the first and second connection terminals includes a first connection surface facing the first band portion, a second connection surface opposing the first connection surface, and a first circumferential surface connecting the first and second connection surfaces, a cross section of the first circumferential surface being circular, each of the third and fourth connection terminals includes a third connection surface facing the second band portion, a fourth connection surface opposing the third connection surface, and a second circumferential surface connecting the third and fourth connection surfaces, a cross section of the second circumferential surface being circular, wherein (1) the first to fourth connection terminals are respectively provided with a reduced-thickness portion defining a groove disposed therein and being open toward a mounting surface, or (2) the first to fourth connection terminals are respectively provided with a hole disposed therein in a direction connecting the first and second surfaces of the capacitor body, and wherein the first and second connection terminals are connected to the first internal electrodes via the first external electrode, and the third and fourth connection terminals are connected to the second internal electrodes via the second external electrode.

2. The multilayer electronic component of claim 1, wherein the first to fourth connection terminals have a cylindrical shape.

3. The multilayer electronic component of claim 1, wherein the first and second connection terminals are spaced apart from an edge of the first band portion, and
the third and fourth connection terminals are spaced apart from an edge of the second band portion.

4. The multilayer electronic component of claim 1, further comprising:
first and second conductive adhesive layers disposed between the first connection terminal and the first band portion and between the second connection terminal and the first band portion, respectively; and
third and fourth conductive adhesive layers disposed between the third connection terminal and the second band portion and between the fourth connection terminal and the second band portion, respectively.

5. The multilayer electronic component of claim 1, further comprising a plating layer respectively plated on external surfaces of the first to fourth connection terminals,
wherein the plating layer comprises one of tin (Sn) and gold (Au).

6. The multilayer electronic component of claim 1, wherein the first and second connection terminals are spaced apart from each other in a direction connecting the fifth and sixth surfaces of the capacitor body, and
the third and fourth connection terminals are spaced apart from each other in the direction connecting the fifth and sixth surfaces of the capacitor body.

7. A board having a multilayer electronic component mounted thereon, the board comprising:
a substrate having first and second electrode pads on one surface; and
a multilayer electronic component including: a capacitor body including a plurality of dielectric layers and a plurality of first and second internal electrodes alternately disposed with the dielectric layer interposed therebetween, the capacitor body having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the plurality of first and second internal electrodes being exposed to the third and fourth surfaces, respectively; first and second external electrodes including first and second connecting portions disposed on the third and fourth surfaces of the capacitor body, respectively, and first and second band portions extending from the first and second connecting portions to portions of the first surface of the capacitor body, respectively, the first and second external electrodes are connected to the plurality of first and second internal electrodes, respectively; first and second connection terminals connected to the first band portion, on a first surface side of the capacitor body, and spaced apart from each other; and third and fourth connection terminals connected to the second band portion, on the first surface side of the capacitor body, and spaced apart from each other, wherein each of the first and second connection terminals includes a first connection surface facing the first band portion, a second connection surface opposing the first connection surface, and a first circumferential surface connecting the first and second connection surfaces, a cross section of the first circumferential surface being circular, and each of the third and fourth connection terminals includes a third connection surface facing the second band portion, a fourth connection surface opposing the third connection surface, and a second circumferential surface connecting the third and fourth connection surfaces, a cross section of the second circumferential surface being circular,
wherein the first and second connection terminals are disposed on the first electrode pad to be connected thereto, and the third and fourth connection terminals are disposed on the second electrode pad to be connected thereto,
wherein (1) the first to fourth connection terminals are respectively provided with a reduced-thickness portion defining a groove disposed therein and being open toward a mounting surface, or (2) the first to fourth connection terminals are respectively provided with a hole disposed therein in a direction connecting the first and second surfaces of the capacitor body, and wherein the first and second connection terminals are connected to the first internal electrodes via the first external electrode, and the third and fourth connection terminals are connected to the second internal electrodes via the second external electrode.

8. The board of claim 7, wherein the first to fourth connection terminals have a cylindrical shape.

9. The board of claim 7, wherein the first and second connection terminals are spaced apart from an edge of the first band portion, and
the third and fourth connection terminals are spaced apart from an edge of the second band portion.

10. The board of claim 7, wherein the multilayer electronic component further comprises:
first and second conductive adhesive layers disposed between the first connection terminal and the first band portion and between the second connection terminal and the first band portion, respectively, and
third and fourth conductive adhesive layers disposed between the third connection terminal and the second band portion and between the fourth connection terminal and the second band portion, respectively.

11. The board of claim 7, further comprising a plating layer respectively plated on external surfaces of the first to fourth connection terminals,
wherein the plating layer comprises at least one of tin (Sn) and gold (Au).

12. The board of claim 7, wherein the first and second connection terminals are spaced apart from each other in a direction connecting the fifth and sixth surfaces of the capacitor body, and
the third and fourth connection terminals are spaced apart from each other in the direction connecting the fifth and sixth surfaces of the capacitor body.

13. A multilayer electronic component comprising:
a capacitor body including dielectric layers and first and second internal electrodes alternately disposed with the dielectric layer interposed therebetween, the capacitor body including first and second surfaces opposing each other;
first and second external electrodes respectively connected to the first internal electrodes and the second internal electrodes, and each including a portion disposed on the first surface of the capacitor body;
a first connection terminal disposed on the portion of the first external electrode; and
a second connection terminal disposed on the portion of the second external electrode,
wherein (1) each of the first and second connection terminals has a reduced-thickness portion defining a recess extending from a lower surface thereof toward an upper surface thereof in a direction from the first surface to the second surface such that the recess of the first connection terminal is spaced apart from the upper surface of the first connection terminal and the recess of the second connection terminal is spaced apart from the upper surface of the second connection terminal, or (2) each of the first and second connection terminals has a recess extending from a lower surface thereof to an upper surface thereof in a direction from the first surface to the second surface, and
wherein the first connection terminal is connected to the first internal electrodes via the first external electrode, and the second connection terminal is connected to the second internal electrodes via the second external electrode.

14. The multilayer electronic component of claim 13, further comprising:
a first conductive adhesive layer disposed between the first connection terminal and the portion of the first external electrode; and
a second conductive adhesive layer disposed between the second connection terminal and the portion of the second external electrode.

15. The multilayer electronic component of claim 13, further comprising a plating layer respectively plated on external surfaces of the first and second connection terminals,
wherein the plating layer comprises one of tin (Sn) and gold (Au).

16. The multilayer electronic component of claim 13, further comprising a third connection terminal disposed on the portion of the first external electrode and spaced apart from the first connection terminal; and
a fourth connection terminal disposed on the portion of the second external electrode and spaced apart from the second connection terminal.

* * * * *